(12) United States Patent
Gupta et al.

(10) Patent No.: US 6,201,267 B1
(45) Date of Patent: Mar. 13, 2001

(54) COMPACT LOW POWER COMPLEMENT FETS

(75) Inventors: Rajesh N. Gupta, Newbury Park, CA (US); Michael Shur, Latham, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 0 days.

(21) Appl. No.: 09/260,320

(22) Filed: Mar. 1, 1999

(51) Int. Cl.⁷ .................................................. H01L 27/10
(52) U.S. Cl. ..................... 257/206; 257/368; 257/369; 257/371; 438/199
(58) Field of Search .................................... 257/369, 371, 257/368, 206; 438/199

(56) References Cited

U.S. PATENT DOCUMENTS

| | | | |
|---|---|---|---|
| 3,514,676 | 5/1970 | Fa | 317/235 |
| 3,539,876 | 11/1970 | Feinberg et al. | 317/101 |
| 4,032,962 | 6/1977 | Balyoz et al. | 357/68 |
| 4,488,348 | 12/1984 | Jolly | 29/571 |
| 4,555,721 | 11/1985 | Bansal et al. | 357/42 |
| 4,622,569 | 11/1986 | Lade et al. | 357/23.4 |
| 4,782,373 | 11/1988 | Lund et al. | 357/23.9 |
| 4,814,851 | 3/1989 | Abrokwah et al. | 357/42 |
| 4,920,400 | 4/1990 | Barsony | 357/58 |
| 5,006,913 | 4/1991 | Sugahara et al. | 357/41 |
| 5,097,311 | 3/1992 | Iwase et al. | 347/42 |
| 5,241,193 | 8/1993 | Pfiester et al. | 257/67 |
| 5,334,861 | 8/1994 | Pfiester et al. | 257/67 |
| 5,409,847 | 4/1995 | Segawa et al. | 437/34 |
| 5,440,154 | * 8/1995 | Carmichael et al. | 257/206 |
| 5,510,636 | 4/1996 | Murata | 257/206 |
| 5,517,041 | * 5/1996 | Forii et al. | 257/206 |
| 5,528,056 | 6/1996 | Shimada et al. | 257/72 |
| 5,612,552 | 3/1997 | Owens | 257/202 |
| 5,616,935 | 4/1997 | Koyama et al. | 257/69 |
| 5,625,200 | 4/1997 | Lee et al. | 257/69 |
| 5,635,736 | * 6/1997 | Funaki et al. | 257/202 |
| 5,635,744 | 6/1997 | Hidaka et al. | 257/349 |
| 5,654,563 | * 8/1997 | Rostoker et al. | 257/206 |
| 5,684,320 | 11/1997 | Kawashima | 257/351 |
| 5,986,292 | * 11/1999 | Mizuno et al. | 257/202 |

OTHER PUBLICATIONS

"A Strong Force in Microelectronics," Rensselaer/Dec. 1977, pp. 18–23.

* cited by examiner

*Primary Examiner*—William Mintel
(74) *Attorney, Agent, or Firm*—Heslin & Rothenberg, P.C.; Wayne F. Reinke, Esq.

(57) ABSTRACT

A complementary Field Effect Transistor includes a first transistor and a second transistor stacked on the first transistor. The angle between the source/drain pair for the first transistor and the source/drain pair for the second transistor is nonzero and other than 180 degrees (e.g., 90 degrees). In one embodiment, each transistor has its own gate, and the active regions for the transistors are separated and situated between the gates. In another embodiment, the active regions for the transistors share a single channel region. In still another embodiment, the transistors share a single gate. In yet another embodiment, the transistors share both a channel region and a gate.

15 Claims, 6 Drawing Sheets

COMPACT LOW POWER COMPLEMENT FETS

BACKGROUND OF THE INVENTION

1. Technical Field

The present invention generally relates to semi-conductor devices. More particularly, the present invention relates to complementary FETs.

2. Background Information

Field Effect Transistors (FETs), and in particular, CMOS (complementary metal oxide semi-conductor) FETs, have become the workhorse of integrated circuits in recent years. The principal advantage of CMOS transistors over other transistors is their much lower power dissipation. As one skilled in the art will appreciate, a CMOS device includes both an N-Channel MOSFET and P-Channel MOSFET. When the input (gate) voltage is high, the NMOS device is turned on and the PMOS device turns off; and when the input voltage is low, the PMOS device turns on and the NMOS device turns off. This is the basic mode of operation of complementary switches.

FIG. 1 depicts a cross-section of a conventional complementary Thin Film Transistor (TFT) 10. A complementary TFT is made by connecting an N-Channel TFT and P-Channel TFT. The N-Channel TFT is separated from the P-Channel TFT by a minimum distance specified by design rules to minimize interaction between the two transistors.

The complementary TFT 10 is created on a glass substrate 12. A buffer layer 14 of silicon dioxide prevents contaminants from the glass substrate from entering the active region. A layer of polycrystalline silicon ("polysilicon") is patterned into active regions 16 and 18. A layer of oxide 20 (gate insulator) separates the active regions from their respective gates 22 and 24. The implantation of an N-type impurity in active region 16 defines source/drain regions 26 and 28. A P-type impurity implanted in active region 18 defines source/drain regions 30 and 32 for the PMOS transistor. One skilled in the art will understand that the above description is merely one example of a method of making a CMOS TFT.

A second exemplary complementary FET structure is shown in FIG. 2. A complementary Heterostructure Insulated Gate Field Effect Transistor (c-HIGFET) 34 is shown in cross-section in FIG. 2. As one skilled in the art will appreciate, a c-HIGFET uses a wide bandgap semiconductor barrier layer, instead of silicon dioxide used in the CMOS device 10 of FIG. 1. The advantage of such a transistor is the high mobility of carriers, due to the reduced impurity and surface scattering.

A wide bandgap semiconductor 38 is placed over narrow bandgap semiconductor 36. As one skilled in the art will know, a "wide bandgap semiconductor" refers to a semi-conductor with a bandgap of about 0.4 eV to about 6.2 eV, for example, AlGaAs. Gates 40 and 42 are separated as shown for the N-channel device and the P-channel device, respectively. An N-type impurity is implanted to create source/drain regions 44 and 46, and similarly, a P-type impurity is implanted to create source/drain regions 48 and 50. Gates 40 and 42 comprise a Schottky metal.

The complementary transistors of FIG. 1 and FIG. 2, though useful advances in the semiconductor field, have their limitations. As an initial matter, the side-by-side design occupies more space than necessary, wasting the space between the N-channel device and the P-channel device. In addition, power dissipation is quite high, posing a constraint on low power applications.

SUMMARY OF THE INVENTION

Briefly, the present invention satisfies the need for a compact complementary FET design that dissipates less power by providing, among additional features, a complementary FET device with a stacked design, where the angle between the source/drain contacts for the—and P-channel devices is nonzero.

In accordance with the above, it is an object of the present invention to provide a complementary FET occupying less space than traditional side-by-side designs.

It is another object of the present invention to provide a complementary FET dissipating less power than conventional side-by-side designs.

The present invention provides, in a first aspect, a semiconductor device, comprising a first Field Effect Transistor (FET), e.g., a P-channel FET, having a first gate, a first channel region and a first source/drain pair, and a second FET, e.g., an N-channel FET, complementary to and vertically adjacent the first FET and having a second gate separate from the first gate, a second channel region and a second source/drain pair. The angle between the first source/drain pair and the second source/drain pair is nonzero and other than 180 degrees, and the first channel region and the second channel region are situated between the first gate and the second gate.

The present invention provides, in a second aspect, a semiconductor device, comprising a first FET, e.g., a P-channel FET, having a first channel region and a first source/drain pair, and a second FET, e.g., an N-channel FET, complementary to and vertically adjacent the first FET and having a second source/drain pair and a second channel region. The semiconductor device further comprises at least one gate common to the first and second FETs. The angle between the first source/drain pair and the second source/drain pair is nonzero and other than 180 degrees.

The present invention provides, in a third aspect, a semiconductor device, comprising an insulating substrate, a first FET on the insulating substrate having a first source/drain pair and comprising one of P-type polysilicon and N-type polysilicon, and a second FET also on the substrate having a second source/drain pair comprising the other of P-type polysilicon and N-type polysilicon. The semiconductor device further comprises a gate common to both FETs, and a channel region common to both FETs comprising intrinsic polysilicon. An angle between the first source/drain pair and the second source/drain pair is nonzero and other than 180 degrees.

The present invention provides, in a fourth aspect, a semiconductor device, comprising a semi-insulating substrate, a narrow bandgap semiconductor layer on the semi-insulating substrate, a wide bandgap semiconductor layer on the narrow bandgap semiconductor layer, a first FET on the wide bandgap semiconductor layer having a first source/drain pair comprising one of a P-type narrow bandgap semiconductor material and an N-type narrow bandgap semiconductor material, and a second FET on the wide bandgap semiconductor layer having a second source/drain pair comprising the other of P-type narrow bandgap semiconductor material and N-type narrow bandgap semiconductor material. The semiconductor device further comprises a gate and a channel region common to both FETs. The channel region comprises unintentionally doped InGaAs, and the angle between the first source/drain pair and the second source/drain pair is nonzero and other than 180 degrees.

These, and other objects, features and advantages of this invention will become apparent from the following detailed description of the various aspects of the invention taken in conjunction with the accompanying drawings.

BEST MODE FOR CARRYING OUT THE INVENTION

Figure 3:
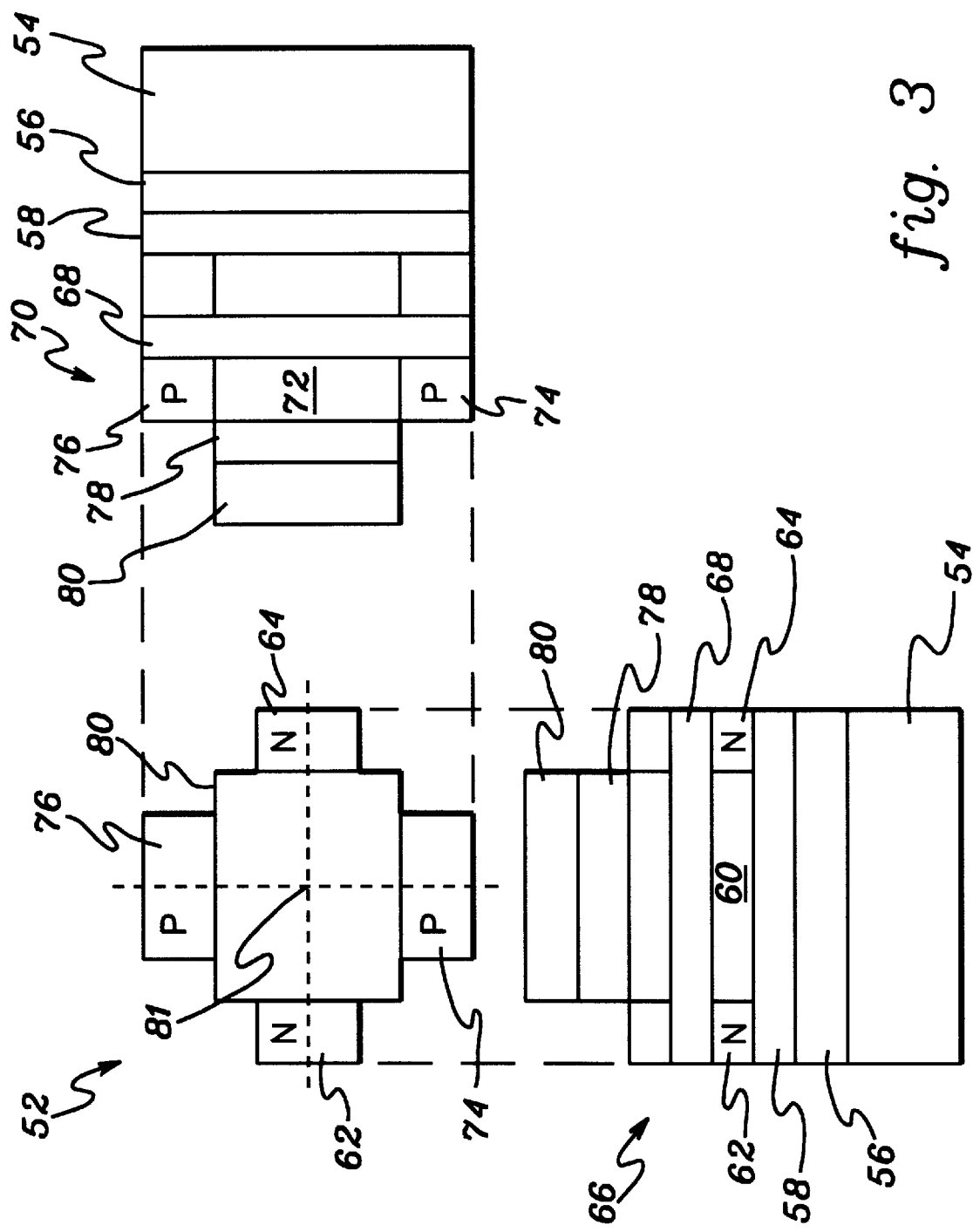
FIG. 3 depicts a complementary FET in accordance with a first aspect of the present invention.

FIG. 3 depicts a first complementary FET 52 in accordance with a first aspect of the present invention. A top view of FET 52 is given in the top left corner of FIG. 3, with the two side views accompanying same. On an insulating substrate 54 is a first gate 56. Substrate 54 could comprise, for example, glass or silicon dioxide. On gate 56 is an insulating barrier layer 58 comprised of, for example, silicon dioxide or silicon nitride. On top of gate insulator 58 is a layer of polysilicon, which contains the active region, namely, the channel region 60, comprising intrinsic polysilicon, and source/drain pair 62/64 of NMOS device 66. As used herein, the term "intrinsic" is meant to encompass trace elements of dopant materials left as a result of imperfections in the particular process used to produce a given layer, referred to herein as "unintentional doping." In addition, although the following description refers to unintentionally doped layers, it will be understood that the absence of trace elements, i.e., truly intrinsic, would be preferred. Another insulating barrier layer 68 separates the active regions for NMOS device 66 and PMOS device 70. As shown, the two devices are said to be vertically adjacent. On top of insulating barrier layer 68 is another layer of polysilicon containing the active region for PMOS device 70; that is, channel region 72 and source/drain pair 74 and 76. PMOS device 70 is said to be complementary to NMOS device 66, i.e., oppositely doped. A third insulating barrier layer 78 separates second gate 80 from the PMOS active region. Gates 56 and 80 could comprise, for example, a gate metal or heavily doped semiconductor material.

Figure 1:
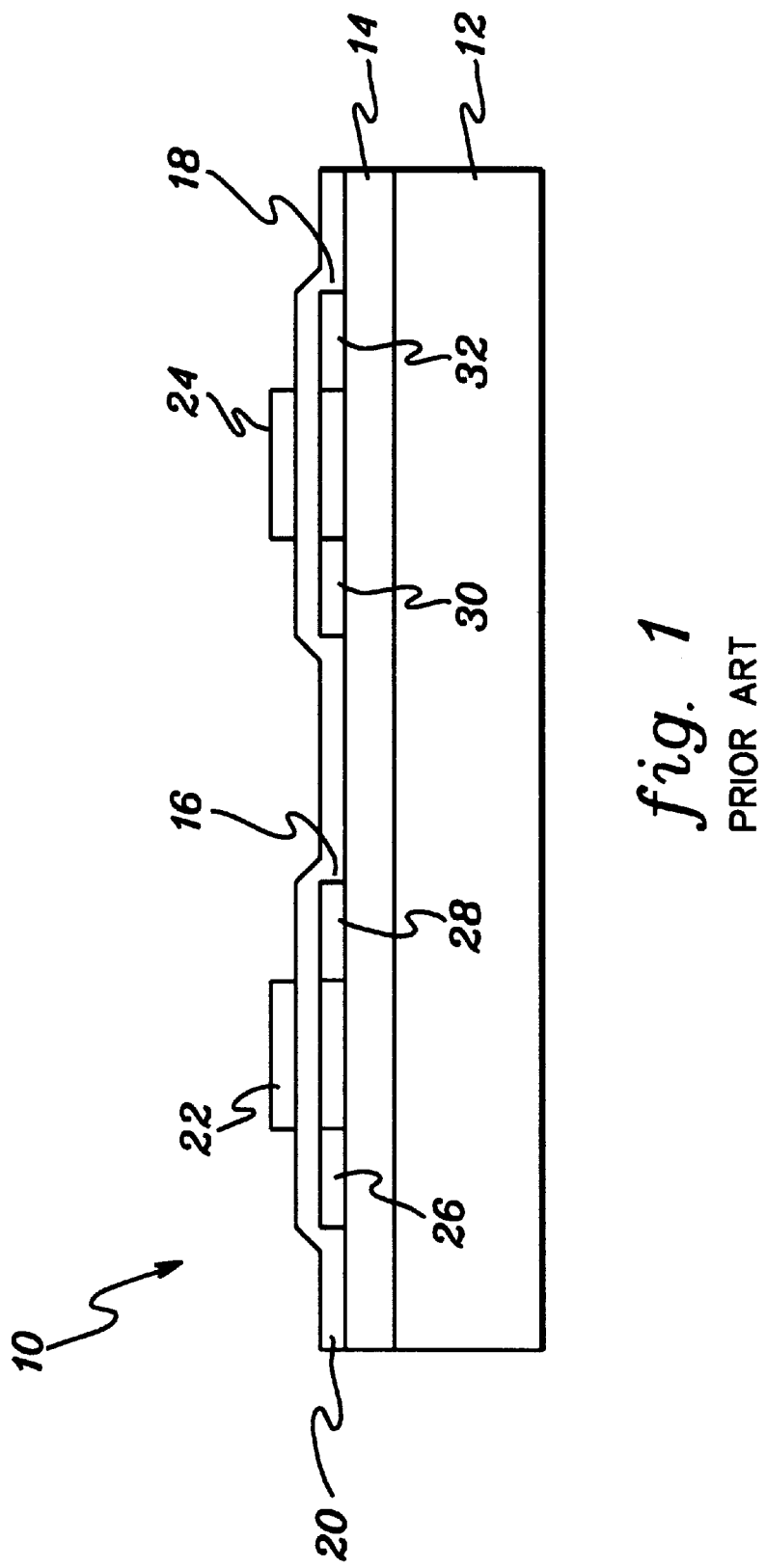
FIG. 1 depicts a cross-section of a conventional complementary Thin Film Transistor.
Figure 2:
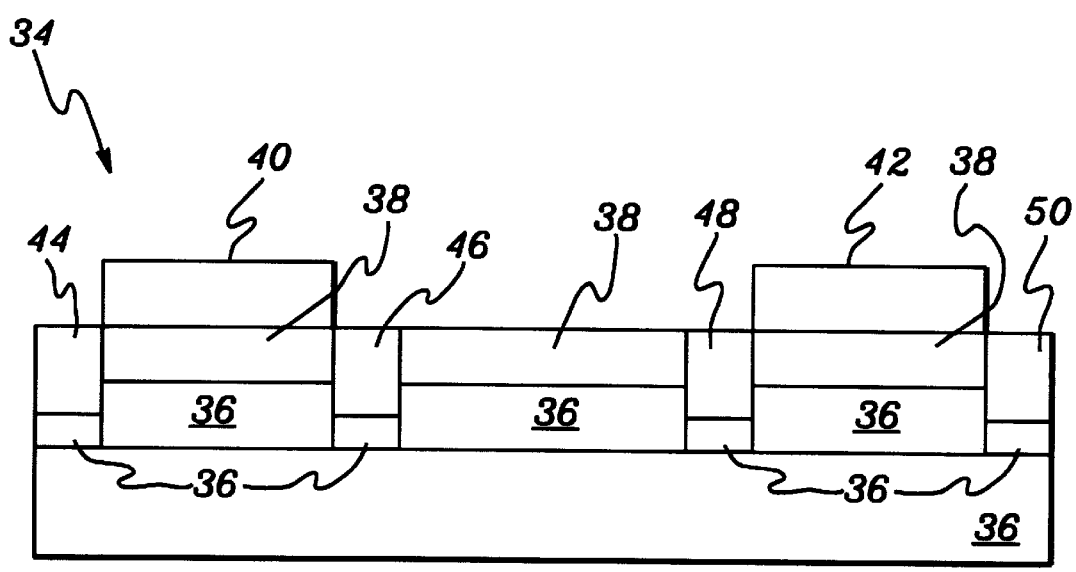
FIG. 2 depicts a cross-section of a conventional complementary Heterostructure Insulated Gate Field Effect Transistor.

The structure of complementary FET 52 has several advantages over a conventional polysilicon CMOS device. First, it occupies a much smaller area, due to the stacked configuration, compared to the CMOS device of FIG. 1. In addition, some complementary FETs will not work for voltages in excess of the forward conducting voltage of a diode, since there exists a parasitic diode connected between power and ground of the complementary FET. However, in the embodiment of FIG. 3, isolation between the two transistors, i.e., PMOS device 70 and NMOS device 66, is accomplished through an insulating barrier layer rather than the junction. The structure of FIG. 3 also has the additional advantage of having two gates (gates 56 and 80) for additional functional capability. Also, since the channel regions are unintentionally doped polysilicon as a result of imperfections in the process used to create them, the sub-threshold slope should be very steep, and thus the threshold voltage can be much lower. This makes the complementary FET of FIG. 3 a good candidate for low power applications. In addition to the other advantages noted above, the structure of FIG. 3 allows each gate to "assist" the other in turning on/off the P and N-Channel transistors.

Aside from the TFT described above, the structure of FIG. 3 can also be used, for example, for a complementary Heterostructure Insulated Gate Field Effect Transistor (c-HIGFET). To accomplish this, the identities of several layers are changed. Substrate 54 would be semi-insulating, and made of a narrow bandgap material (e.g., GaAs). Gate 56 would be a heavily doped layer of the same material. Instead of insulating barrier layer 58, a barrier layer of a wide bandgap material (e.g., AlGaAs), lightly doped with the opposite type of impurity as layer 56 would be used. As used herein, the terms "narrow" and "wide" are relative to each other, with the narrow bandgap material having a bandgap at least a few tenths of an electron—Volt less than that for the wide bandgap material. A layer of narrow bandgap material (e.g., InGaAs) is then epitaxially grown, followed by epitaxial growth of a layer 68 of the wider bandgap material. Another narrow/wide-bandgap layer pair is then epitaxially grown. The narrow bandgap material is unintentionally doped, as a result of imperfections in the growth process. Also, layer 78 would not be etched for a c-HIGFET. A Schottky contact is then made, which acts as the top gate 80 shown in FIG. 3. The material for the P-Channel active region and N-Channel active region would comprise, for example, the respective type of InGaAs. Although a c-HIGFET has been described using GaAs-based materials, it will be understood that GaN, SiC and other similar materials could be used.

An angle 81 between source/drain pair 62 and 64 and source/drain pair 74 and 76 is nonzero and other than 180 degrees; in this case, 90 degrees. A nonzero and other than 180 degree angle is chosen, since the contacts should not overlap or be parallel. Otherwise, the particular angle in a given case is a design parameter. The same is true for the other embodiments discussed below.

Figure 4:
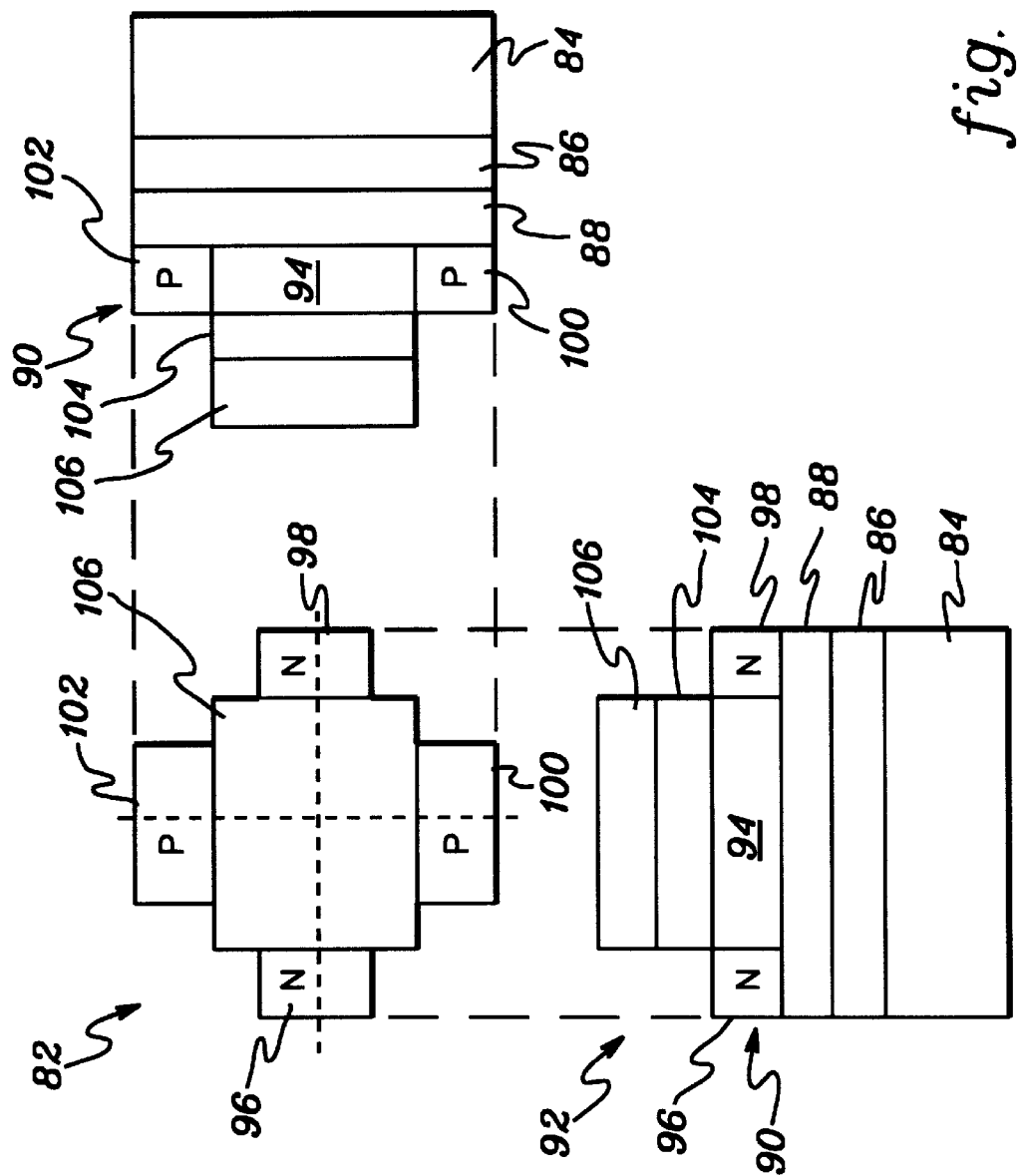
FIG. 4 depicts a variation of the complementary FET of FIG. 3.

If it is desired that the complementary FET be used for extremely low voltage operation, the layer separating the active regions for the P-Channel and N-Channel devices can be eliminated, resulting in a common channel region for both devices. FIG. 4 depicts a complementary FET 82 with such a structure. It will be recognized that if the two gates were connected together, a robust NOR-gate is created. This is because, even if one of the transistors (corresponding to one of the gates) does not work, the nor-gate would still work as it would be driven by the gate that does work.

Complementary FET 82 comprises substrate 84, lower gate conductor 86, insulating barrier layer 88, and common active region 90. Actually, the common portion of the active region comprises only channel 94. The source/drain pair for NMOS device 92 comprises N-type impurity doped regions 96 and 98. Similarly, for the PMOS device, source/drain regions 100 and 102 comprise P-type impurity doping. Over common channel region 94 is another insulating barrier layer 104. Finally, upper gate conductor 106 lies on top of layer 104.

As used herein, the term "X-type" refers to a particular substance doped with impurities such that holes (X=P) or electrons (X=N) dominate.

As with the embodiment of FIG. 3, the structure of FIG. 4 could be used, for example, as either a thin film CMOS device, or a c-HIGFET device. For the thin film CMOS device, the source/drain regions could be, for example, polysilicon doped with the appropriate type of impurity, the common channel region could be unintentionally doped polysilicon, and the substrate could be insulating (e.g., glass). For the c-HIGFET device the substrate would be semi-insulating, e.g., semi-insulating GaAs, the barrier layers could be, for example, AlGaAs, and the source/drain regions could be, for example, InGaAs with appropriate dopant impurities. In addition, layer 104 would not be etched for a c-HIGFET device. Finally, the common gate 106 could be, for example, a metal on heavily-doped semiconductor, and the common channel region could be unintentionally doped InGaAs.

Figure 5:
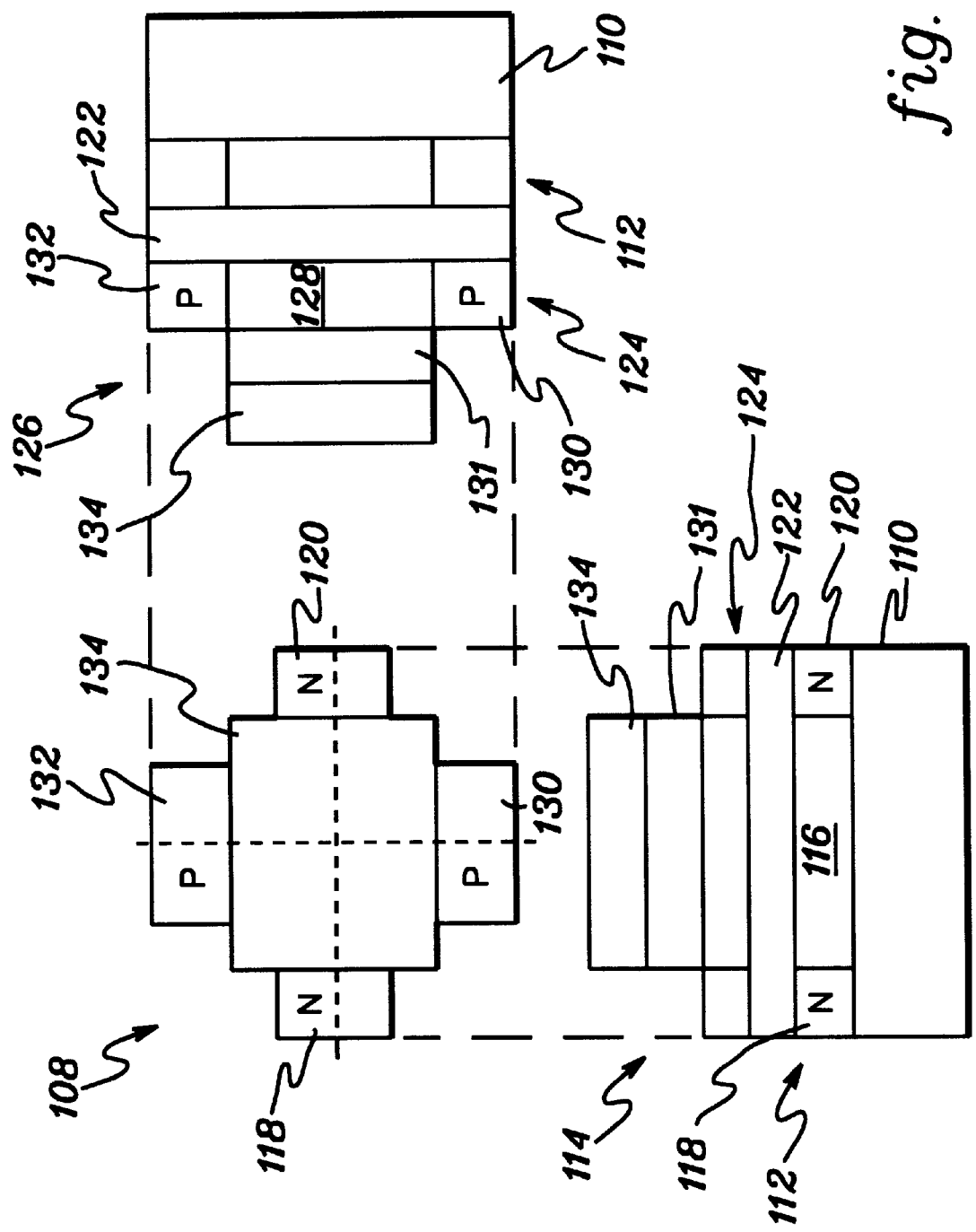
FIG. 5 depicts a complementary FET in accordance with a second aspect of the present invention.

FIG. 5 depicts the structure of another complementary FET 108 in accordance with the present invention. The FIG. 5 structure includes two stacked FETs sharing a common gate. Complementary FET 108 comprises substrate 110 upon which is an active region 112 for N-channel device 114. Active region 112 comprises channel 116 and source/drain pair 118 and 120. Barrier layer 122 separates active region 112 and active region 124 (the active region for P-channel device 126). Active region 124 comprises channel 128 and source/drain pair 130 and 132. It will be understood that the positions of active regions 112 and 124 could be switched within FET 108. On top of active region 124 is another insulating barrier layer 131. Above barrier layer 131 is gate conductor 134. As shown in FIG. 5, the P-channel device 126 and N-channel device 114 share gate 134.

Figure 6:
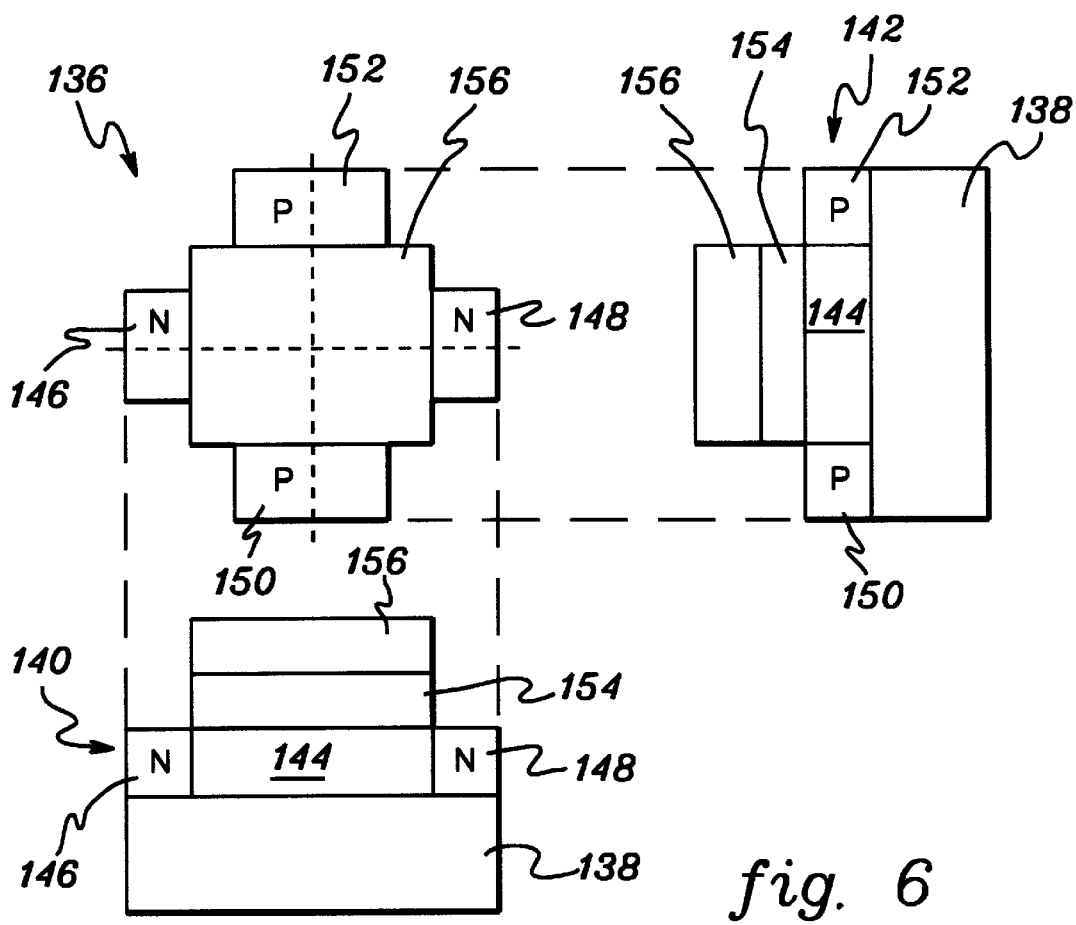
FIG. 6 depicts a complementary FET in accordance with third and fourth aspects of the present invention.

FIG. 6 depicts still another complementary FET 136 in accordance with the present invention. The structure of FIG. 6 incorporates both the shared channel region of FIG. 4 and the shared gate of FIG. 5. On substrate 138 are active regions 140 and 142, sharing common channel region 144. Source/drain pair 146 and 148 are doped with N or P-type impurities (in FIG. 6, they are doped with N-type impurities). Similarly, source/drain pair 150 and 152 are doped with the complementary type of impurity (in this case, a P-type impurity). On top of common channel region 144 is an insulating barrier layer 154 separating it from gate conductor 156.

As with the other embodiments, the structure of either of the complementary FETs of FIGS. 5 and 6 could be used, for example, as either a thin film CMOS device, or a c-HIGFET device. For the thin film CMOS device, the source/drain regions could be, for example, polysilicon doped with the appropriate type of impurity, the channel regions could be unintentionally doped polysilicon, and the substrate could be insulating (e.g., glass). For the c-HIGFET device, the substrate could be semi-insulating (e.g., semi-insulating GaAs), the barrier layers could be, for example, AlGaAs, the source/drain regions could be, for example, InGaAs with appropriate dopant impurities, and the channel regions could be, for example, unintentionally doped InGaAs. Finally, the gate material could be, for example, a metal or heavily-doped semiconductor material.

Figure 7:
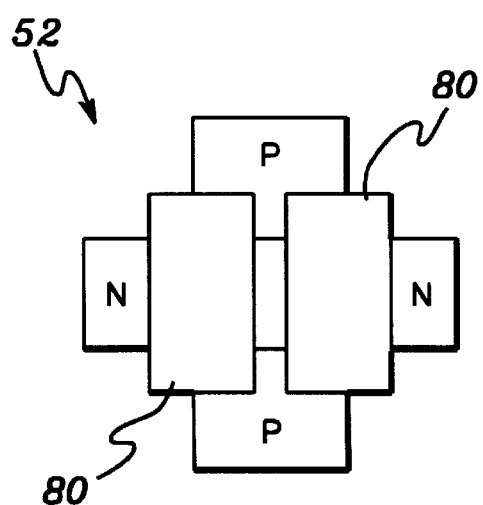
FIG. 7 depicts a complementary FET in accordance with the present invention having optional multiple gates.

Optionally, the top gate conductor in all of the embodiments above could be split into two or more gates, in order to increase the functionality of the device. FIG. 7 depicts FET 52 from FIG. 3 with gate 80 split in half. By splitting the top gate, different types of logic devices can be created. For example, splitting the gate vertically in two, as in FIG. 7, creates a NAND gate. If the gate is split in the other direction (i.e., horizontally), a NOR gate would be produced. Splitting the gate into more than two parts would produce an N-input NOR/NAND gate, where N equals the number of split gates.

Due to the high sub-threshold slope of the proposed complementary FET, it can be used with low voltage power supplies. Satisfactory operation of the structures have been simulated for voltages as low as 0.7 volts. This translates into a reduction in power dissipation compared to the conventional complementary FET counterparts by orders of magnitude.

Since the structure of the present inventive complementary FET is more compact, the same number of transistors can be packed into a much smaller space. This means that the lines connecting the different transistors can be shorter and hence the interconnect delay, directly related to the square of the length of the lines, will also be drastically reduced. It is worth pointing out that the speed of present day microprocessors is limited more than anything by the interconnect delays. In addition, the smaller gate capacitance of the present invention will help increase the speed further.

The present invention would be useful, for example, in present day CMOS-based digital integrated circuits, such as memory devices (e.g., SRAM), and microprocessors.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

What is claimed is:

1. A semiconductor device, comprising:

a first Field Effect Transistor (FET) having a first gate, a first channel region and a first source/drain pair;

a second FET complementary to and vertically adjacent the first FET, and having a second gate separate from the first gate, a second channel region and a second source/drain pair;

wherein an angle between the first source/drain pair and the second source/drain pair is nonzero and other than 180 degrees; and wherein the first channel region and the second channel region are situated between the first gate and the second gate.

2. The semiconductor device of claim 1, wherein the first channel region and the first source/drain pair are separated from the second channel region and the second source/drain pair by an insulating barrier layer.

3. A semiconductor device, comprising:

a first Field Effect Transistor (FET) having a first gate, a first channel region and a first source/drain pair;

a second FET complementary to and vertically adjacent the first FET, and having a second gate separate from the first gate, a second channel region and a second source/drain pair;

wherein an angle between the first source/drain pair and the second source/drain pair is nonzero and other than 180 degrees;

wherein the first channel region and the second channel region are situated between the first gate and the second gate; and wherein the first channel region and the second channel region comprise a common channel region.

4. The semiconductor device of claim 1, further comprising an insulating substrate on which one of the first gate and the second gate is deposited, wherein the first channel region and the second channel region comprise intrinsic polycrystalline silicon (polysilicon), wherein one of the first source/drain pair and the second source/drain pair comprises P-type polysilicon, and wherein the other of the first source/drain pair and the second source/drain pair comprises N-type polysilicon.

5. The semiconductor device of claim 1, further comprising a semi-insulating substrate on which one of the first gate and the second gate is deposited, wherein the first channel region and the second channel region comprise a narrow bandgap semiconductor material, wherein one of the first source/drain pair and the second source/drain pair comprises a P-type narrow bandgap semiconductor material, and wherein the other of the first source/drain pair and the second source/drain pair comprises an N-type narrow bandgap semiconductor material.

6. A semiconductor device, comprising:
a first Field Effect Transistor (FET) having a first channel region and a first source/drain pair;
a second FET complementary to and vertically adjacent the first FET, and having a second source/drain pair and a second channel region;
at least one gate common to the first FET and the second FET; and
wherein an angle between the first source/drain pair and the second source/drain pair is nonzero and other than 180 degrees.

7. The semiconductor device of claim 6, wherein the first channel region and the first source/drain pair are separated from the second channel region and the second source/drain pair by an insulating barrier layer.

8. The semiconductor device of claim 6, wherein the first channel region and the second channel region comprise a common channel region.

9. The semiconductor device of claim 6, wherein the at least one gate comprises a plurality of gates.

10. The semiconductor device of claim 6, further comprising a semi-insulating substrate on which one of the first channel region and the second channel region is deposited, wherein the first channel region and the second channel region comprise intrinsic polycrystalline silicon (polysilicon), wherein one of the first source/drain pair and the second source/drain pair comprises P-type polysilicon, and wherein the other of the first source/drain pair and the second source/drain pair comprises N-type polysilicon.

11. The semiconductor device of claim 6, further comprising a semi-insulating substrate on which one of the first channel region and the second channel region is deposited, wherein the first channel region and the second channel region comprise a narrow bandgap semiconductor material, wherein one of the first source/drain pair and the second source/drain pair comprises a P-type narrow bandgap semiconductor material, and wherein the other of the first source/ drain pair and the second source/drain pair comprises an N-type narrow bandgap semiconductor material.

12. A semiconductor device, comprising:
an insulating substrate;
a first Field Effect Transistor (FET) on the insulating substrate having a first source/drain pair comprising one of P-type polysilicon and N-type polysilicon;
a second FET on the insulating substrate having a second source/drain pair comprising the other of P-type polysilicon and N-type polysilicon;
a gate common to the first FET and the second FET;
a channel region common to the first FET and the second FET comprising intrinsic polysilicon;
wherein an angle between the first source/drain pair and the second source/drain pair is nonzero and other than 180 degrees.

13. The semiconductor device of claim 12, further comprising an insulating barrier layer between the gate and the channel region.

14. A semiconductor device, comprising:
a semi-insulating substrate;
a narrow bandgap semiconductor layer on the semi-insulating substrate;
a wide bandgap semiconductor layer on the narrow bandgap semiconductor layer;
a first Field Effect Transistor (FET) on the wide bandgap semiconductor layer having a first source/drain pair comprising one of a P-type narrow bandgap semiconductor material and an N-type narrow bandgap semiconductor material;
a second FET on the wide bandgap semiconductor layer having a second source/drain pair comprising the other of P-type narrow bandgap semiconductor material and N-type narrow bandgap semiconductor material;
a gate common to the first FET and the second FET;
a channel region common to the first FET and the second FET comprising unintentionally doped InGaAs;
wherein an angle between the first source/drain pair and the second source/drain pair is nonzero and other than 180 degrees.

15. The semiconductor device of claim 14, further comprising an insulating barrier layer between the gate and the channel region.

* * * * *